United States Patent
Adusumilli et al.

(10) Patent No.: US 11,152,520 B1
(45) Date of Patent: Oct. 19, 2021

(54) PHOTODETECTOR WITH REFLECTOR WITH AIR GAP ADJACENT PHOTODETECTING REGION

(71) Applicant: GLOBALFOUNDRIES U.S. Inc., Santa Clara, CA (US)

(72) Inventors: Siva P. Adusumilli, South Burlington, VT (US); Mark D. Levy, Williston, VT (US); Vibhor Jain, Williston, VT (US); John J. Ellis-Monaghan, Grand Isle, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/868,773

(22) Filed: May 7, 2020

(51) Int. Cl.
| | |
|---|---|
| *H01L 31/0232* | (2014.01) |
| *H01L 27/144* | (2006.01) |
| *H01L 31/18* | (2006.01) |
| *H01L 31/105* | (2006.01) |
| *H01L 31/028* | (2006.01) |

(52) U.S. Cl.
CPC .... *H01L 31/02327* (2013.01); *H01L 27/1446* (2013.01); *H01L 31/028* (2013.01); *H01L 31/105* (2013.01); *H01L 31/1808* (2013.01)

(58) Field of Classification Search
CPC ........... H01L 31/02327; H01L 31/1808; H01L 31/105; H01L 31/028; H01L 27/1446
See application file for complete search history.

(56) References Cited

U.S. PATENT DOCUMENTS

| | | |
|---|---|---|
| 7,397,101 B1 | 7/2008 | Masini et al. |
| 7,777,250 B2 | 8/2010 | Lochtefeld |
| 7,790,495 B2 | 9/2010 | Assefa et al. |
| 7,795,064 B2 | 9/2010 | Pan et al. |
| 9,064,699 B2 | 6/2015 | Wang et al. |
| 9,864,138 B2 | 1/2018 | Coolbaugh et al. |
| 10,119,857 B2 | 11/2018 | Li et al. |
| 10,157,947 B2 | 12/2018 | Chen et al. |
| 10,388,806 B2 | 8/2019 | Chen et al. |
| 10,546,963 B2 | 1/2020 | Hon et al. |
| 2007/0099315 A1 | 5/2007 | Maa et al. |
| 2008/0070355 A1 | 3/2008 | Lochtefeld et al. |
| 2011/0037133 A1 | 2/2011 | Su et al. |
| 2013/0284269 A1* | 10/2013 | Clifton ............... H01L 31/028 136/261 |
| 2014/0054662 A1* | 2/2014 | Yanagita ............ H01L 27/1463 257/291 |

(Continued)

OTHER PUBLICATIONS

Liao et al., "36 GHz submicron silicon waveguide germanium photodetector." Optics express. vol. 19, No. 11. May 23, 2011. pp. 10967-10972.

(Continued)

*Primary Examiner* — Sitaramarao S Yechuri
(74) *Attorney, Agent, or Firm* — Hoffman Warnick LLC (57) ABSTRACT

A photodetector includes a photodetecting region in a semiconductor substrate, and a reflector extending at least partially along a sidewall of the photodetecting region in the semiconductor substrate. The reflector includes an air gap defined in the semiconductor substrate. The reflector allows use of thinner germanium for the photodetecting region. The air gap may have a variety of internal features to direct electromagnetic radiation towards the photodetecting region.

19 Claims, 8 Drawing Sheets

(56) References Cited

U.S. PATENT DOCUMENTS

| | | |
|---|---|---|
| 2014/0159183 A1 | 6/2014 | Na |
| 2016/0155884 A1* | 6/2016 | Hon et al. |
| 2017/0047367 A1* | 2/2017 | Lee .................. H01L 27/1464 |
| 2018/0151759 A1* | 5/2018 | Huang ............... H01L 31/0232 |
| 2018/0204761 A1 | 7/2018 | Feilchenfeld et al. |
| 2019/0165026 A1* | 5/2019 | Kuo .................. H01L 27/1462 |

OTHER PUBLICATIONS

Koester et al., "Germanium-on-insulator photodetectors." 2005 IEEE International Conference on Group IV Photonics. 2005. 3 pages.

Ryu et al., "High performance of InGaN light-emitting diodes by air-gap/GaN distributed Bragg reflectors." Optics express. Apr. 2012. pp. 9999-10003.

Knoll et al., "High-performance BiCMOS Si photonics platform," 2015 IEEE Bipolar/BiCMOS Circuits and Technology Meeting—BCTM, Boston, MA, 2015, pp. 88-96.

Jutzi et al., "Ge-on-Si Vertical Incidence Photodiodes With 39-GHz Bandwidth," IEEE Photonics Technology Letters, vol. 17, No. 7, Jul. 2005, pp. 1510-1512.

Huang et al., "Germanium on Silicon Avalanche Photodiode," IEEE Journal of Selected Topics in Quantum Electronics, vol. 24, No. 2. Mar./Apr. 2018, 11 pages.

* cited by examiner

PHOTODETECTOR WITH REFLECTOR WITH AIR GAP ADJACENT PHOTODETECTING REGION

BACKGROUND

The present disclosure relates to photodetectors, and more specifically, to a photodetector including a reflector including an air gap adjacent a photodetecting region.

Photodetectors, also known as photosensors, sense electromagnetic radiation such as light, and convert the radiation to electronic signals. A photodetector may include a p-n or a p-i-n junction that converts photons into electrical current. Photodetectors may include, for example, photodiodes and photo transistors, among other structures.

Germanium is oftentimes used as a photodetecting material in semiconductor photodetectors because it absorbs electromagnetic radiation well compared to other materials. One challenge with the use of germanium in a photodetector is that the photodetecting region must have a thickness of greater than one micrometer in order to absorb longer wavelengths of electromagnetic radiation, e.g., >1 micrometers. However, formation of germanium at such thicknesses can be expensive and time-consuming. A photodetecting region with a larger area may be used, but it uses more area than is desired. Other approaches to avoid the use of thicker germanium include using: metallic mirrors, oxide filled trenches, or waveguides under the photodetector region, to direct electromagnetic radiation to a smaller germanium layer. In one approach, a germanium-tin alloy is used for the photodetecting region. A problem with the afore-mentioned approaches is that they cannot be integrated with complementary metal-oxide semiconductor (CMOS) or bipolar CMOS (bi-CMOS) devices.

SUMMARY

Aspects of the disclosure provide a photodetector, comprising: a photodetecting region in a semiconductor substrate; and a reflector extending at least partially along a sidewall of the photodetecting region in the semiconductor substrate, the reflector including an air gap defined in the semiconductor substrate.

Further aspects of the disclosure provide a method, comprising: forming a photodetecting region in a semiconductor substrate; and forming a reflector extending at least partially along a sidewall of the photodetecting region in the semiconductor substrate, the reflector including an air gap defined in the semiconductor substrate.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present disclosure, and it is to be understood that other embodiments may be used, and that changes may be made without departing from the scope of the present disclosure. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Figure 1:
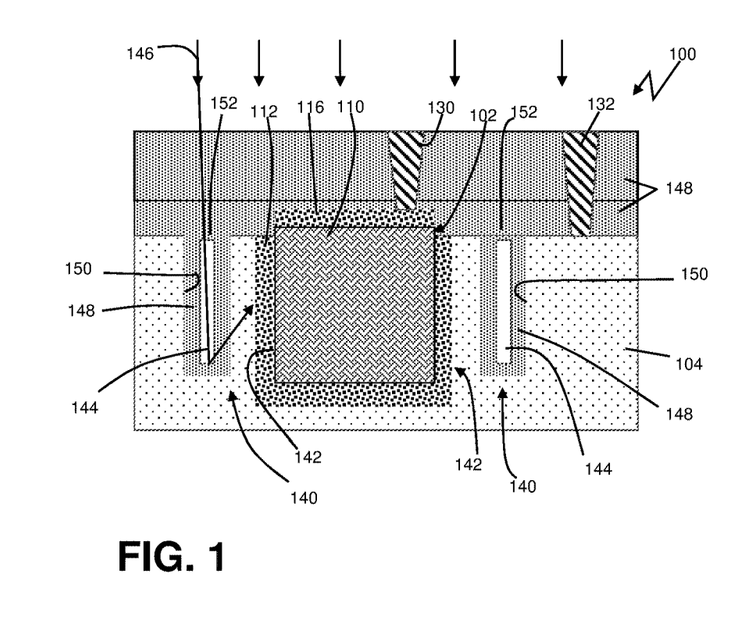
FIG. 1 shows a cross-sectional view of a photodetector including a reflector having an air gap, according to embodiments of the disclosure.
Figure 2:
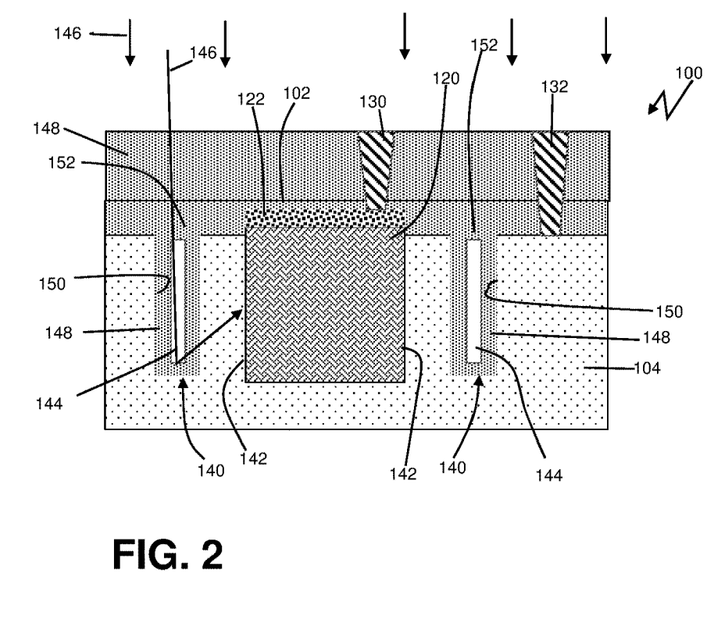
FIG. 2 shows a cross-sectional view of a photodetector including a reflector having an air gap, according to other embodiments of the disclosure.

FIGS. 1 and 2 show cross-sectional views of a photodetector 100 according to various embodiments of the disclosure. Photodetector 100 includes a photodetecting region 102 in a semiconductor substrate 104. Semiconductor substrate 104 may include but is not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Semiconductor substrate 104 may be an n-type semiconductor, i.e., a semiconductor material listed above and doped with an n-type dopant. N-type dopants are introduced to semiconductor to generate free electron (by "donating" electron to semiconductor), and have one more valance electron than semiconductor. Common n-type dopants in a semiconductor such as silicon include: phosphorous (P), arsenic (As) or antimony (Sb).

Photodetecting region 102 can be any light absorption or optical semiconductor material, such as but not limited to: germanium, silicon, gallium arsenide, gallium nitride, gallium phosphide, indium gallium arsenide, indium arsenide antimonide, or mercury cadmium telluride. The optical semiconductor material is generally selected for its ability to absorb electromagnetic radiation, e.g., light of the target wavelength. The optical semiconductor material may be an intrinsic form of the semiconductor material used, i.e., without dopants therein. Photodetecting region 102 may be a vertically oriented structure, e.g., a fin, or may be a more three-dimensional, e.g., a cube, cylinder, etc.

Figures 8, 9:
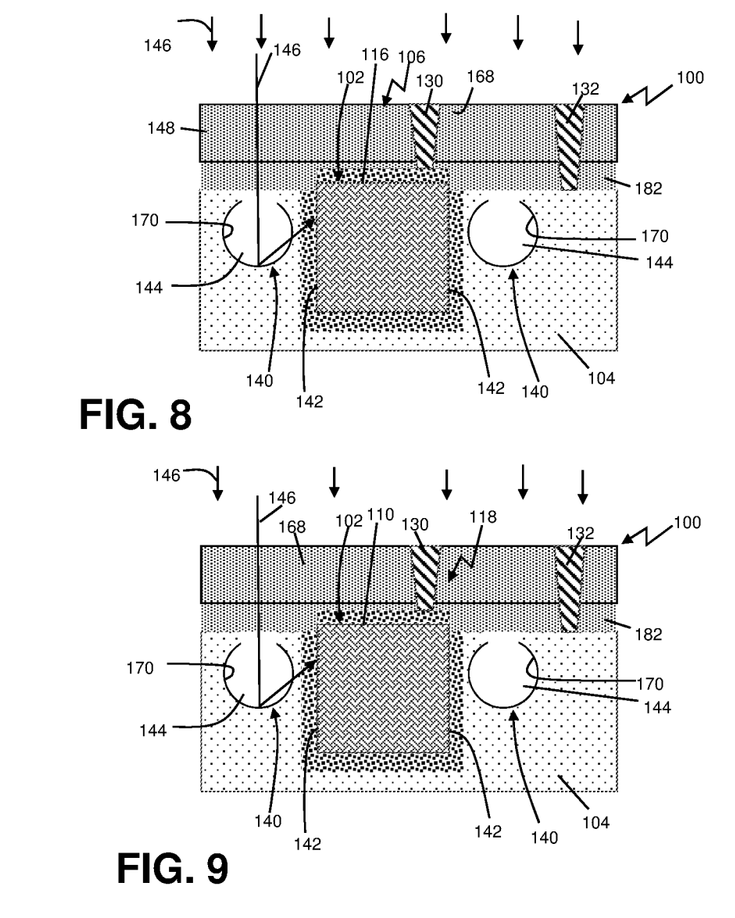
FIG. 8 shows a cross-sectional view of a photodetector including a reflector having an air gap, according to embodiments of the disclosure.
FIG. 9 shows a cross-sectional view of a photodetector including a reflector having an air gap, according to other embodiments of the disclosure.
Figure 10:
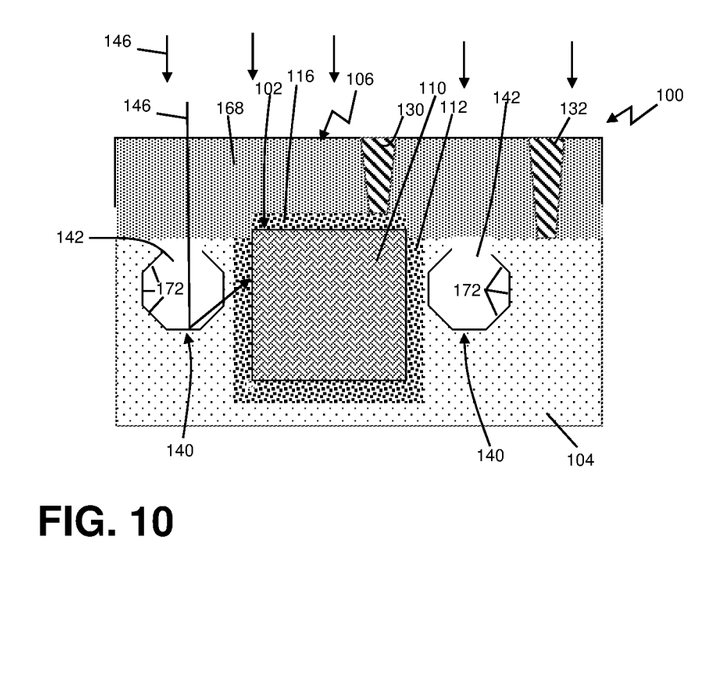
FIG. 10 shows a cross-sectional view of a photodetector including a reflector having an air gap, according to embodiments of the disclosure.
Figure 11:
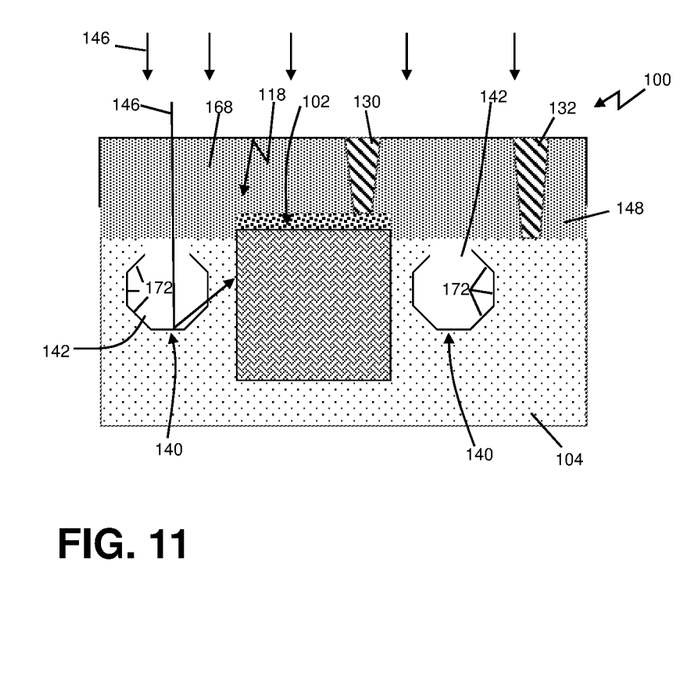
FIG. 11 shows a cross-sectional view of a photodetector including a reflector having an air gap, according to other embodiments of the disclosure.

Photodetecting region 102 may take the form of a couple of different photodiode formats. For example, FIGS. 1, 8 and 10 show photodetecting region 102 arranged to create an avalanche photodiode (APD) 106. In this case, photodetecting region 102 includes an optical semiconductor material 110, e.g., intrinsic germanium, positioned in a p-type semiconductor liner 112 in n-type semiconductor substrate 104, and a p-type semiconductor layer 116 over optical semiconductor material 110. In contrast, FIGS. 2, 9 and 11 show photodetecting region 102 arranged to create a P-I-N photodiode 118. In this case, photodetecting region 102 includes optical semiconductor material 120, e.g., intrinsic germanium, in n-type semiconductor substrate 104 and with a p-type semiconductor layer 122 over optical semiconductor material 120. P-type semiconductor liner 112 is omitted in FIGS. 2, 9 and 11.

In accordance with embodiments of the disclosure, photodetector 100 includes a reflector 140 extending at least partially along a sidewall 142 of photodetecting region 102 in semiconductor substrate 104. Incident electromagnetic radiation 146 is reflected by reflector(s) 140 towards sidewall(s) 142 of photodetecting region 102 to allow absorption of the electromagnetic radiation, e.g., light. Reflectors 140, as will be described, are configured to direct electromagnetic radiation 146 towards sidewall(s) 142 of photodetecting region 102 despite being oriented in parallel with the path of incident electromagnetic radiation 146. Depending on the horizontal cross-sectional shape of photodetecting region 102, reflector(s) 140 can be positioned in any location and in any number to provide the desired electromagnetic radiation re-direction toward sidewall(s) 142 of the photodetecting region. The cross-sectional views of, for example, FIGS. 1 and 2 show a reflector 140 along two sidewalls 142 of photodetecting region 102; however, as will be described herein, more or less than two reflectors 140 may be disposed about photodetecting region 102. Alternatively, reflector 140 may surround photodetecting region 102. In contrast to conventional photodetectors, reflector 140 includes an air gap 144 defined in semiconductor substrate 104. Air gap 144 may be oriented parallel to a path (arrows) of incident electromagnetic radiation 146, e.g., light. Photodetecting region 102 can be thinner than conventional photodetecting regions due to the reflectivity of reflectors 140, reducing the cost and complexity of forming photodetecting region 102, and allowing photodetector 100 to be integrated in conventional CMOS and Bi-CMOS devices. The extent photodetecting region 102 is thinner than conventional regions can vary depending on many factors such as but not limited to: the type of electromagnetic radiation, the type of optical semiconductor material, the number of reflections created by the reflectors, the rate of absorption of the optical semiconductor material, etc.

Referring to FIGS. 1 and 2, air gap 144 extends vertically along substantially all of sidewall 142 of photodetecting region 102, e.g., >85% of sidewall 142 height. That is, a longitudinal extent of air gap 144 extends vertically along substantially all of sidewall 142 of photodetecting region 102, and may extend to a depth equal to or greater than a depth of sidewall 142. In FIGS. 1 and 2, air gap 144 is defined in a dielectric 148 within a trench 150. Dielectric 148 may have refractive index that is different than semiconductor substrate 104 and may include, for example, silicon oxide (doped like boro-phospho-silicate glass (BPSG), or undoped), or other dielectric. In this example, silicon oxide is more reflective than semiconductor substrate 104. Other dielectrics may be less reflective within semiconductor substrate 104. Dielectric 148 includes a pinch off closure 152 sealing air gap 144.

Referring to FIGS. 3-7, one embodiment of a method of forming air gap 144, as shown in FIGS. 1 and 2, is illustrated. Generally, the method includes forming photodetecting region 102 in semiconductor substrate 104, and forming reflector(s) 140 extending at least partially along sidewall(s) 142 of photodetecting region 102 in semiconductor substrate 104. As noted, reflector(s) 140 include air gap(s) 144 defined in semiconductor substrate 104. The order in which photodetecting region 102 or reflector(s) 140 are formed may vary. In the example of FIGS. 3-7, forming photodetecting region 102 occurs prior to forming reflector 140.

Figure 3:
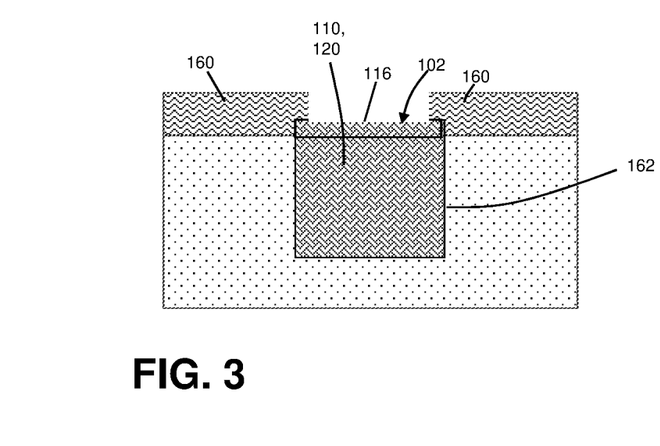
FIG. 3 shows a cross-sectional view of forming an optical semiconductor material, according to embodiments of a method of the disclosure.

As shown in FIG. 3, semiconductor substrate 104 may have a patterned mask 160 formed thereover, which is used to etch a trench 162 for photodetecting region 102. Mask 160 may include any now known or later developed mask material. Common masking materials are photoresist (resist) and nitride. Nitride is usually considered to be a "hard mask." Mask 160 may include a developable organic planarization layer (OPL) on the layer to be etched, a developable anti-reflective coating (ARC) layer on the developable OPL, and a photoresist mask layer on the developable ARC layer. Etching generally refers to the removal of material from a substrate (or structures formed on the substrate), and is often performed with a mask in place so that material may selectively be removed from certain areas of the substrate, while leaving the material unaffected in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, a RIE may be used to form trench 162.

FIG. 3 also shows forming optical semiconductor material 110, 120, e.g., intrinsic germanium, in trench 162 to form at least part of photodetecting region 102 (FIG. 5). Optical semiconductor material 110, 120 may be, for example, epitaxially grown in trench 162. The terms "epitaxial growth" and "epitaxially formed and/or grown" mean the growth of a semiconductor material on a deposition surface of a semiconductor material, e.g., semiconductor substrate 104, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces (like mask 160), such as silicon dioxide or silicon nitride surfaces.

In FIG. 3, photodetecting region 102 matches that shown in FIG. 2, i.e., it includes just intrinsic germanium and no p-type semiconductor layer 112 (FIG. 1). For the FIG. 1 embodiment, ion implanting may be performed to create p-type semiconductor layer 112, i.e., prior to epitaxially growing optical semiconductor material 110. FIG. 3 also shows forming p-type semiconductor layer 116 over optical semiconductor material 110 to finalize formation of photodetecting region 102. P-type semiconductor layer 116 may be formed, for example, by ion implanting p-type dopants into optical semiconductor region 110. P-type dopants are introduced to semiconductor to generate free hole (by "accepting" electron from semiconductor atom and "releasing" hole at the same time); the acceptor atom must have one valence electron less than host semiconductor. Boron (B) is the most common acceptor in silicon technology, but alternatives include indium and gallium. After processing, mask 160 may be removed, e.g., using any known ashing process.

Figure 4:
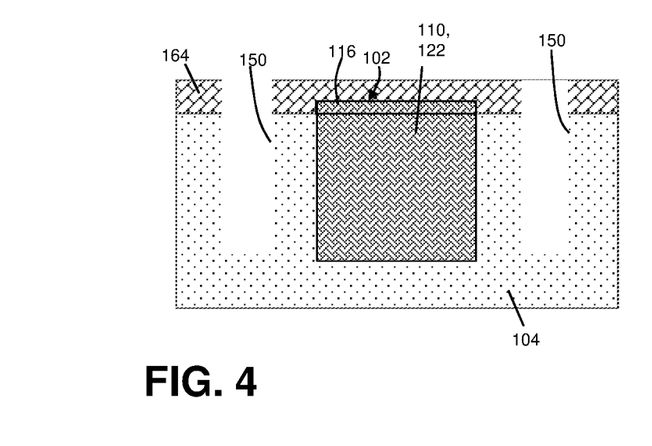
FIG. 4 shows a cross-sectional view of forming an opening adjacent the optical semiconductor material, according to embodiments of a method of the disclosure.
Figure 5:
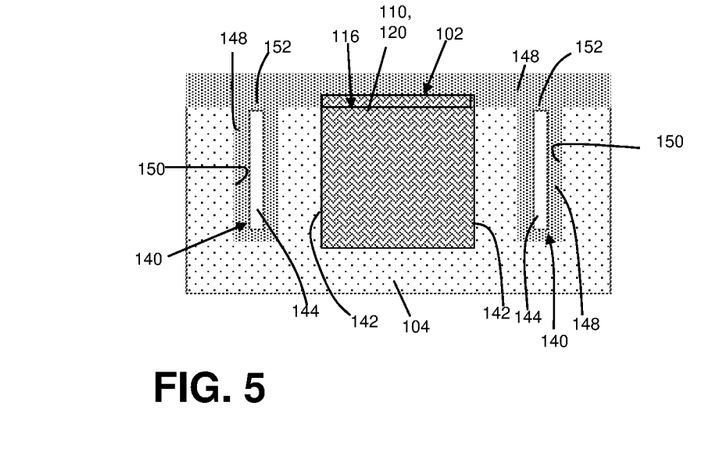
FIG. 5 shows a cross-sectional view of sealing the opening adjacent the optical semiconductor material to form a reflector with an air gap and a photodetector including the reflector, according to embodiments of a method of the disclosure.

FIG. 4 shows forming a patterned mask 164, which is used to etch trench(es) 150 for reflector(s) 140 (FIG. 5). Mask 164 may include any now known or later developed mask material. In this embodiment, trench(es) 150 for reflector(s) 140 (FIGS. 1 and 2) may be etched as a deep trench, e.g., 1 to 6 micrometers in depth. Trench 150 may be etched simultaneously to formation of trenches for trench isolations in other parts of a CMOS or Bi-CMOS device.

After this processing, mask 164 may be removed, e.g., using any known ashing process. FIG. 5 shows depositing a dielectric 148. As noted, dielectric 148 has a different reflectivity than semiconductor substrate 104 and may include, for example, a more reflective material like silicon oxide.

"Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, dielectric 148 may be deposited by ALD. As noted, dielectric 148 includes pinch off closure 152 sealing air gap 144.

As shown in FIGS. 1 and 2, photodetector 100 may further include a first contact 130 to p-type semiconductor layer 116, 122, and a second contact 132 to n-type semiconductor substrate 104. Dielectric 148 that is used to pinch off air gaps 144 may further provide an interlayer dielectric (ILD) in which contacts 130, 132 to photodetector 100 are provided, or additional dielectric may be deposited. That is, dielectric may provide ILD for back-end-of-line processing. Contacts 130, 132 may be formed using any now known or later developed integrated circuit fabrication techniques.

Figure 6:
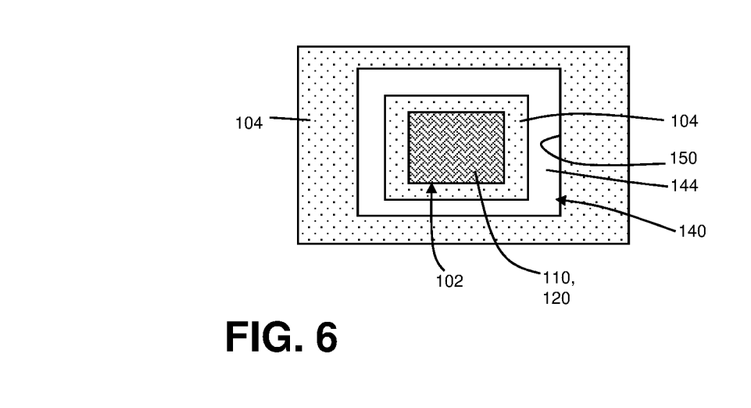
FIG. 6 shows a plan view of a photodetector including a reflector having an air gap, according to embodiments of the disclosure.
Figure 7:
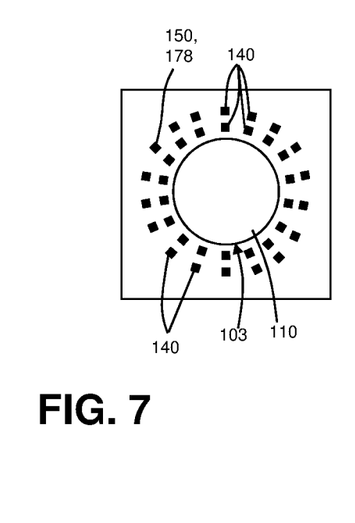
FIG. 7 shows a plan view of a photodetector including a reflector having an air gap, according to other embodiments of the disclosure.

With further regard to FIG. 4, mask 164 and formation of trench(es) 150 therewith dictates the layout of reflector(s) 140. As shown in a plan view in FIG. 6 through air gap 144, trench 150 may extend around and/or surround photodetecting region 102, or as shown in FIG. 7, trench 150 may be individual, isolated trenches. Reflectors 140 and air gaps 144 thereof may have the same arrangement as trench(es) 150. In FIG. 6, air gap 144 surrounds photodetecting region 102. FIG. 7 also shows that a plurality of reflectors 140 may be provided in discrete, spaced arrangements about optical semiconductor material 110, 120. That is, air gap 144 includes a plurality of spaced air gaps 144 surrounding photodetecting region 102, creating a plurality of reflectors. Here, forming reflector 140 includes forming a plurality of air gaps 144 surrounding photodetecting region 102, and hence a plurality of reflectors 140 surrounding photodetecting region 102. FIG. 7 shows a plurality of reflectors 140 in a radially aligned, and circumferentially spaced arrangement, about photodetecting region 102. It is emphasized that any arrangement of reflectors 140 to create the desired re-directing of electromagnetic radiation towards sidewall(s) 142 of optical semiconductor material 110, 120 may be employed.

FIGS. 8-11 show cross-sectional view of other embodiments of photodetector 100. In these embodiments, air gap 144 extends vertically along a portion of sidewall 142 of photodetecting region 102. That is, a vertical extent of air gap 144 extends along only a portion of a vertical extent of sidewall 142 of photodetecting region 102. In FIGS. 8 and 9, air gap 144 has a concave inner surface 170. In FIGS. 10 and 11, air gap 144 includes a plurality of interconnected internal surfaces 172 creating a polygonal cross-section. In the examples shown, the polygonal cross-section is an octagon; however, any polygonal cross-section capable of formation using the etching processes described herein, may be employed, e.g., hexagon, square, rectangle, etc.

Referring to FIGS. 3 and 12-14, embodiments of a method to form the structures of FIGS. 8-11 will now be described. Again, the method includes forming photodetecting region 102 in semiconductor substrate 104, and forming reflector(s) 140 extending at least partially along sidewall 142 of photodetecting region 102 in semiconductor substrate 104. In FIGS. 3 and 12-14, forming photodetecting region 102 occurs prior to forming reflector 140. For brevity's sake, in FIGS. 13-14, the left side shows formation of reflector 140 for the FIGS. 8 and 9 embodiments with photodetecting region of 102 of FIG. 9 only, and the right side shows formation of reflector 140 for the FIGS. 10 and 11 embodiments with photodetecting region of 102 of FIG. 11 only. It is recognized that the teachings of these drawings are equally applicable to the photodetecting region 102 of FIGS. 8 and 10 embodiments. Any differences in processing will be raised, where appropriate.

As described herein, FIG. 3 shows forming of photodetecting region 102, including: forming optical semiconductor material 110, 120, e.g., intrinsic germanium, in trench 162, and forming p-type semiconductor layer 116 over optical semiconductor material 110 to finalize formation of photodetecting region 102. For the FIGS. 8 and 10 embodiments, p-type semiconductor layer 112 may be formed, e.g., by ion implantation, prior to epitaxially growing optical semiconductor material 110.

Figure 12:
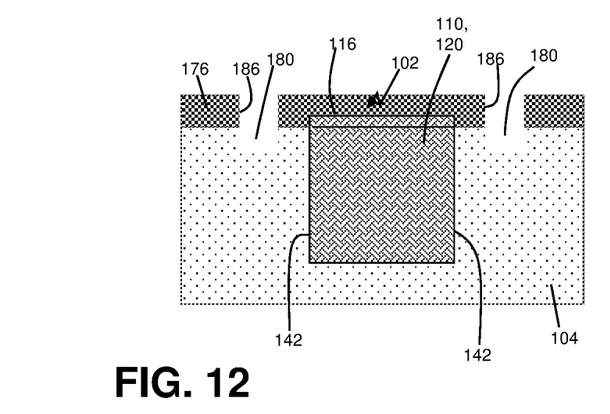
FIG. 12 shows a cross-sectional view of initially forming an opening adjacent a photodetecting region, according to embodiments of a method of the disclosure.

FIG. 12 shows forming a patterned mask 176 over photodetecting region 102 of FIG. 3. Patterned mask 176 is used to etch opening 178 (FIG. 13) for reflector(s) 140 (FIGS. 8-11, 14), e.g., as a shallow trench. Mask 176 may include any now known or later developed mask material. Mask 176 may be formed over any previously formed mask (not shown) used to form optical semiconductor material 110, 120, and the pattern formed through both masks. In this embodiment, as shown in FIG. 12, an initial opening 180 e.g., <1 micrometer in depth, may be etched, e.g., by RIE, into semiconductor substrate 104 adjacent sidewall 142 of photodetecting region 102. The etching of FIG. 12 does not extend into semiconductor substrate 104 other than to create initial opening 180.

Figure 13:
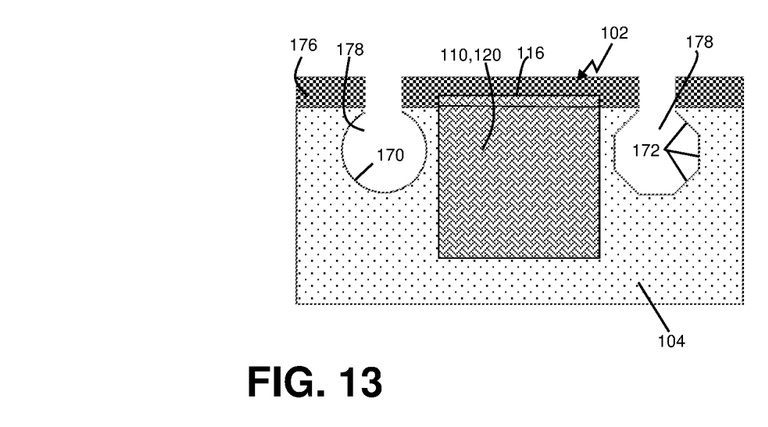
FIG. 13 shows a cross-sectional view of forming the opening adjacent the photodetecting region, according to embodiments of a method of the disclosure.
Figure 14:
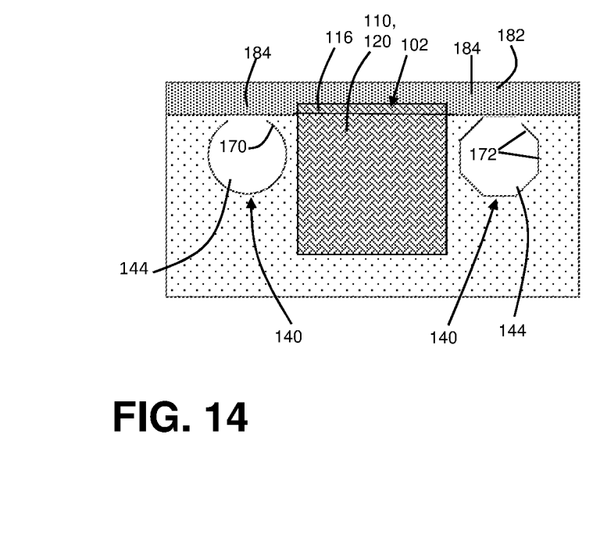
FIG. 14 shows a cross-sectional view of sealing the opening adjacent the photodetecting region to form a reflector with an air gap and a photodetector including the reflector, according to embodiments of a method of the disclosure.

As shown in FIG. 13, a next etch may be performed to create opening 178 (FIG. 14) for reflector 140. The next etch may continue to use mask 176, or it may be removed, e.g., using any known ashing process As shown in the left side of FIG. 13, to form the FIGS. 8 and 9 embodiments, the next etch may include an isotropic etch, e.g., additional RIE, that creates opening 178 with concave inner surface 170 (FIGS. 8, 9). Here, opening 178 may be generally spherical or bulbous. The etching can be controlled, e.g., chemistry, strength, duration, etc., to create the desire concavity, e.g., radius, focal point, etc., to direct electromagnetic radiation towards sidewall 142 of photodetecting region 102. In contrast, as shown in the right side of FIG. 13, to form the FIGS. 10 and 11 embodiments, the next etch may include one or more crystallographic etches that creates opening 178 with plurality of interconnected internal surfaces 172, creating a polygonal cross-section (FIGS. 10, 11). Any number of crystallographic etches can be carried out to reveal the desired crystallographic planes, e.g., <101>, <100>, <110>, <111>, etc., inside opening 178. In the examples shown, the polygonal cross-section is an octagon; however, any polygonal cross-section capable of formation using the etching processes described herein, may be employed. The crystallographic etching(s) can be controlled, e.g., chemistry, strength, duration, etc., to create the desire internal surfaces 172, e.g., length, angle between surfaces, etc., to direct electromagnetic radiation towards sidewall(s) 142 of photodetecting region 102. If still in place, mask 176 may be removed, e.g., using any known ashing process FIG. 14 shows depositing a dielectric 182 to seal opening 178 and create reflector 140 with air gap 144 in semiconductor substrate 104. Dielectric 182 can be any now known or later developed dielectric capable of sealing opening 178, i.e., it creates a pinch off closure 184 sealing air gap 144. In one non-limiting example, dielectric 182 may include silicon oxide.

As shown FIGS. 8-11, contacts 130, 132 may be formed using any now known or later developed integrated circuit fabrication techniques, e.g., in an interlayer dielectric (ILD) 168 over photodetector 100. Dielectric 168 can be the same material as dielectric 182, or may be different dielectric.

With further regard to FIG. 12, mask 176 and forming of opening(s) 178 therewith dictates the layout of reflector(s) 140. As shown in a plan view in FIG. 7, similar to described relative to trench(es) 150, opening(s) 178 may be individual, isolated openings. In this manner, a plurality of reflectors 140 may be provided in discrete, spaced arrangements about photodetecting region 102. FIG. 7 shows a plurality of reflectors 140 in a radially aligned, and circumferentially spaced arrangement, about photodetecting region 102, i.e., optical semiconductor 110, 120. Consequently, reflectors 140 and air gaps 144 thereof may have the same arrangement. It is emphasized that any arrangement of reflectors 140 to create the desired re-directing of electromagnetic radiation towards sidewall(s) 142 of photodetecting region 102 may be employed. As shown in the plan view of FIG. 15, mask 176 may be patterned to create a plurality of connected openings 186. After etching, air gap 144 thus may include a plurality of interconnected voids 188 in semiconductor substrate 104 that collectively form single trench or void, e.g., in a horizontal plane. In this manner, air gap 144 can surround photodetecting region 102.

Referring to FIGS. 16-19, other embodiments of a method to form a photodetector 100 are shown. Again, the method generally includes forming photodetecting region 102 in semiconductor substrate 104, and forming reflector(s) 140 extending at least partially along sidewall(s) 142 of photodetecting region 102 in semiconductor substrate 104. In contrast to FIGS. 3-5 and 12-14, in FIGS. 16-19, forming photodetecting region 102 occurs after forming reflector 140.

Figure 15:
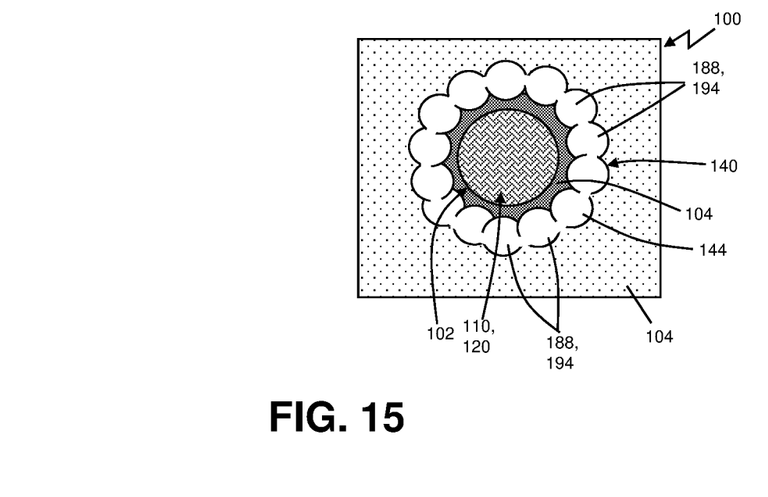
FIG. 15 shows a plan view of a photodetector including a reflector having an air gap, according to embodiments of the disclosure.
Figure 16:
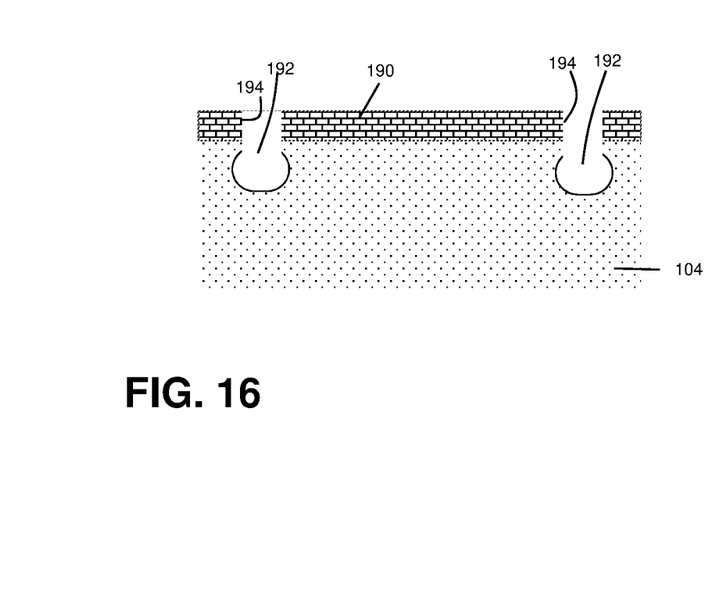
FIG. 16 shows a cross-sectional view of forming an opening in a semiconductor substrate, according to embodiments of a method of the disclosure.

FIG. 16 shows forming a patterned mask 190, which is used to etch opening(s) 192 for reflector(s) 140 (FIG. 19) in semiconductor substrate 104. Semiconductor substrate 104 may be as described herein, e.g., n-type doped semiconductor. Mask 190 may include any now known or later developed mask material. Mask 190 and formation of opening(s) 192 therewith dictates the layout of reflector(s) 140. In this embodiment, opening(s) 192 for reflector 140 may be etched as a shallow trench, e.g., <5 micrometers in depth. Openings 192 may be individual, discrete openings, as in FIG. 7, or may be connected to collectively form a single trench or void. For example, after etching, as shown after sealing in FIG. 15, air gap 144 may include a plurality of interconnected voids 194 in semiconductor substrate 104 that collectively form single trench or void, e.g., in a horizontal plane. In this manner, reflector 140 with air gap 144 can surround photodetecting region 102. Other arrangements of discrete reflectors 140 may also be formed in this manner.

Figure 17:
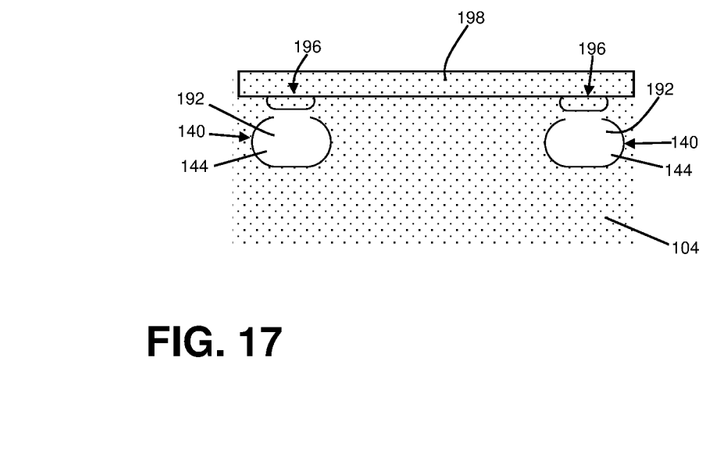
FIG. 17 shows a cross-sectional view of sealing the opening to form a reflector with an air gap, according to embodiments of a method of the disclosure.

FIG. 17 shows forming a pinch-off closure 196 to seal opening(s) 192 and form air gap(s) 144 of reflector(s) 140. In this embodiment, pinch-off closure 196 may be formed by epitaxially growing semiconductor, e.g., silicon germanium (SiGe). Pinch-off closure 196 thus includes semiconductor. The epitaxial growth merges an upper region(s) of opening(s) 192 to form air gap 144. A first semiconductor layer 198, e.g., silicon, may then be formed over pinch-off closure(s) 196. A thickness of first semiconductor layer 198 can be controlled to, as will be described, control a vertical position of reflector(s) 140 relative to sidewalls 142 of photodetecting region 102 (FIG. 19) to be formed next to reflector(s) 140, e.g., above, below, or level with an upper surface of, photodetecting region 102.

Figure 18:
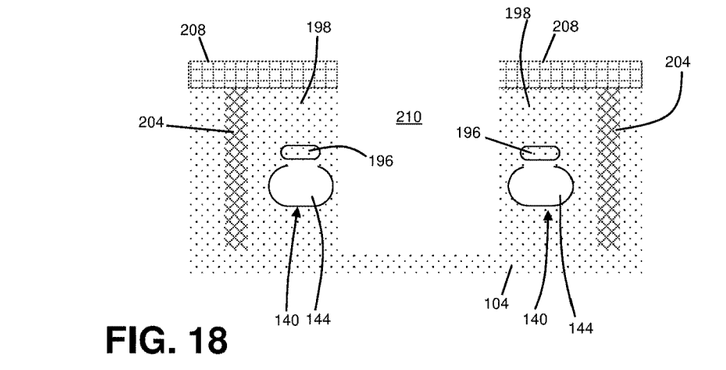
FIG. 18 shows a cross-sectional view of forming an opening for a photodetecting region adjacent the reflector, according to embodiments of a method of the disclosure.

FIG. 18 also shows a number of additional steps. FIG. 18 shows formation of shallow trench isolations (STIs) 204. STIs 204 are trenches etched into semiconductor substrate 104 and filled with an insulating material, such as silicon oxide, to isolate one region of the substrate from an adjacent region of the substrate. FIG. 18 also shows forming a patterned mask 208 for forming an opening 210 for optical photodetecting material formation. Mask 208 may include any now known or later developed mask material. Mask 208 and formation of opening 210 therewith dictates the layout of optical semiconductor material 212 (FIG. 19) and photodetecting region 102 (FIG. 19), which can be customized in, for example, shape, size, proximity to reflector(s) 140.

Figure 19:
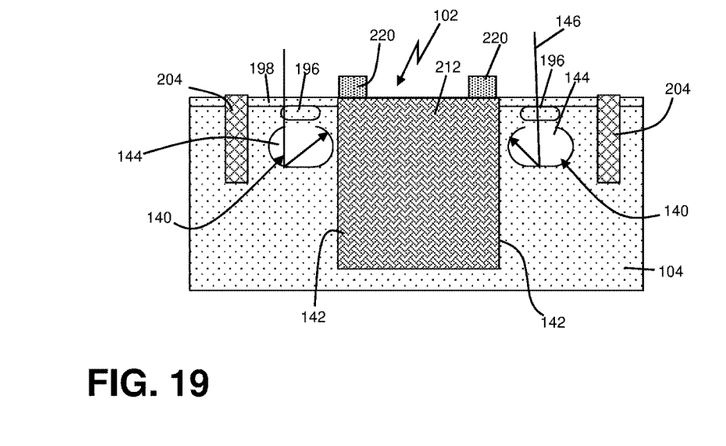
FIG. 19 shows a cross-sectional view of forming the photodetecting region adjacent the reflector to form a photodetector, according to embodiments of a method of the disclosure.

FIG. 19 shows formation of optical semiconductor material 212 in opening 210 (FIG. 17) to form photodetecting region 102. Optical semiconductor material 212 may include any of the materials described herein, e.g., intrinsic germanium. Optical semiconductor material 212 may be, for example, epitaxially grown in opening 210. Prior to formation of optical semiconductor material 212, if an avalanche photodiode is desired, inner surfaces of opening 210 (FIG. 18) can be doped with a p-type dopant to form a p-type semiconductor layer (like 112 in FIG. 1), e.g., by ion implantation or epitaxial growth of a p-type doped layer prior to formation of optical semiconductor material 212. FIG. 19 also shows forming p-type contacts 220 on optical semiconductor region 212, e.g., p-type doped polysilicon wires. Subsequent processing may include any now known or later developed back-end-of-line techniques.

Figure 20:
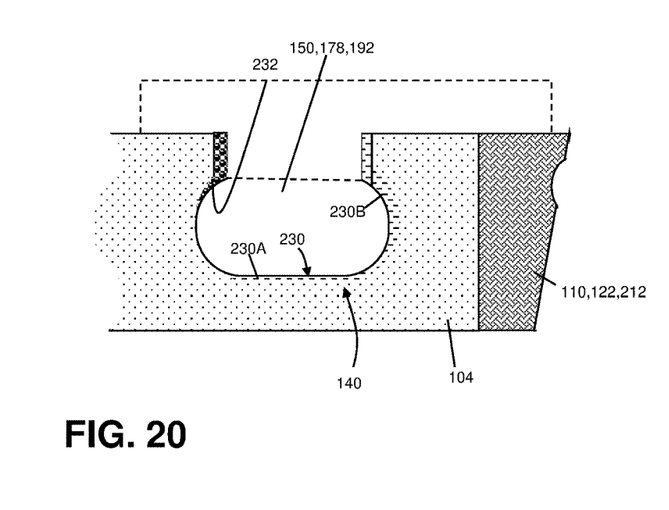
FIG. 20 shows a cross-sectional view of an optional step of forming a liner in the opening adjacent the photodetecting region, according to embodiments of a method of the disclosure.

Referring to FIG. 20, an optional process for forming reflector(s) 140 may include forming a liner 230 on at least a portion of an inner surface 232 of the opening used to form air gap(s) 144. In this case, the opening is formed, the liner is formed, and the opening sealed to form air gap(s) 144. Liner 230 may be formed using any now known or later developed deposition technique, e.g., ALD or oxidation, and where desired, any appropriate etching process to customize the location of the liner. As described herein, opening(s) for air gap 144 may take a variety of forms. Any of the openings in semiconductor substrate 104 described herein, such as trench(es) 150 in FIG. 4, opening(s) 178 in FIG. 13, or opening(s) 192 in FIG. 16, may have liner 230 applied thereto. In addition, liner 230 may be applied to air gaps 144 including a plurality of interconnected voids 188, 194 (FIG. 15). In FIG. 20, the various forms of openings are collectively illustrated as in FIG. 13 for brevity sake. Liner 230 includes at least one material having a different reflectivity than would be provided by inner surface 232, i.e., of semiconductor substrate 104. Liner 230 may include material that is more reflective than semiconductor substrate 104, or less reflective than semiconductor substrate 104. Liner 230 may include for example a dielectric such as silicon oxide that may add reflectivity, or it may include an anti-reflective layer to reduce reflectivity, or it could include both but in different regions. Liner 230 may also include a portion 230A that is more reflective, and a portion 230B that is less reflective than semiconductor substrate 104. In the latter case, for example, portion 230A may be formed and then portion 230B may be formed, where desired thereover. Alternatively, part of the first portion formed may be removed, e.g., by etching, and replaced with the other portion. In any event, customization of liner materials and positioning of liner 230 can thus allow customization of the reflectivity of reflector 140.

Figure 21:
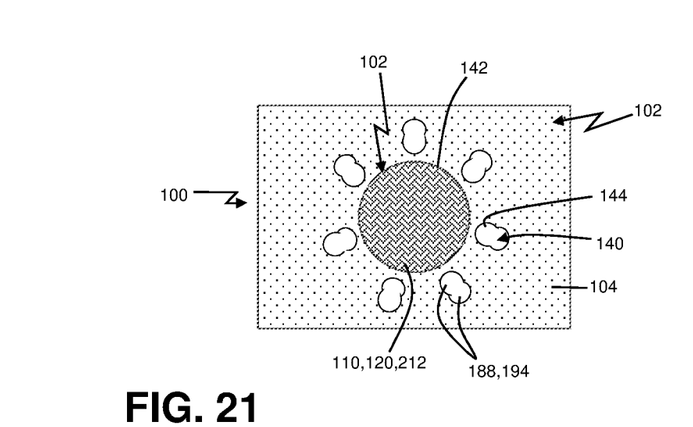
FIG. 21 shows a plan view of a photodetector including a reflector having an air gap, according to alternative embodiments of the disclosure.
Figure 22:
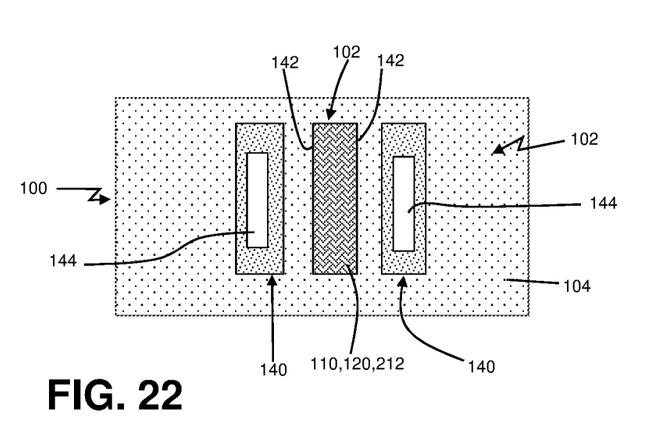
FIG. 22 shows a plan view of a photodetector including a reflector having an air gap, according to other alternative embodiments of the disclosure.

While particular arrangements of reflector 140 have been described herein, it is emphasized that reflector 140 including air gap 144 may have any desired arrangement to direct electromagnetic radiation toward sidewall(s) 142 of photodetecting region 102, i.e., optical semiconductor material 110, 120, 212. For example, FIG. 21 shows reflectors 140 including air gaps 144, each with a pair of interconnected voids 188, 194 circumferentially spaced about a cylindrical optical semiconductor material 110, 120, 212 (creates generally peanut-shaped air gap cross-section). FIG. 22 shows another example in which reflectors 140 including air gaps 144 are spaced along only a couple of sidewalls 142 of a vertical fin-shaped (rectangular in cross-section), photodetecting region 102.

Figure 23:
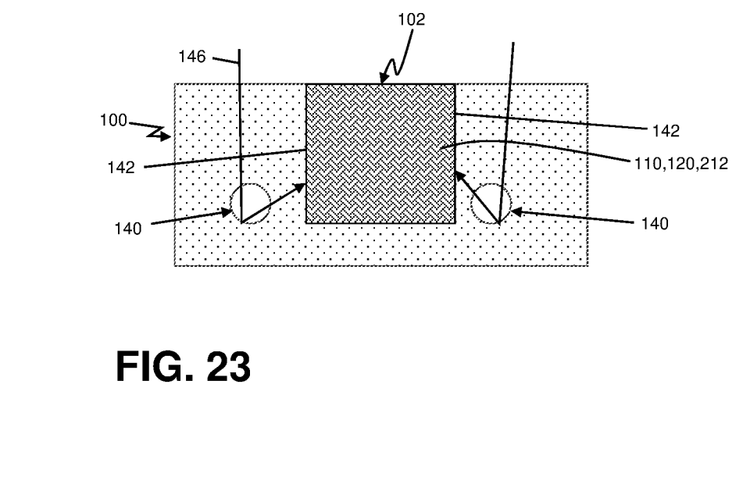
FIG. 23 shows a cross-sectional view of a photodetector including a reflector having an air gap, according to alternative embodiments of the disclosure.
Figure 24:
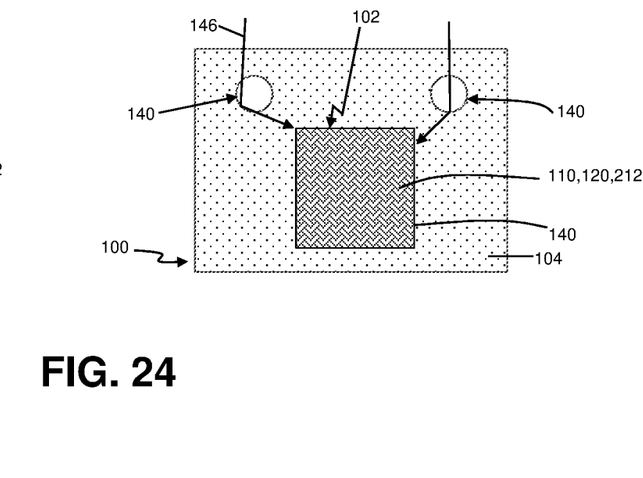
FIG. 24 shows a cross-sectional view of a photodetector including a reflector having an air gap, according to other alternative embodiments of the disclosure.

In addition to the various horizontal layouts, any reflector 140 may also be customized in vertical extent and vertical location relative to photodetecting region 102, to provide the desired reflectivity of electromagnetic radiation toward sidewall(s) 142 of the photodetecting region. In terms of vertical position, reflector(s) 140 can be level with an upper surface of photodetecting region 102, i.e., optical semiconductor material 110, 120, 212. Alternatively, as shown in the cross-sectional view of FIG. 23, reflector(s) 140 can be below photodetecting region 102, or as shown in the cross-sectional view of FIG. 24, reflector(s) 140 can be above photodetecting region 102. Dopant concentrations in the various parts described herein may also be customized to generate the desired photodetector 100. In addition, while a particular order of the type of dopants have been described herein, one with skill in the art will recognize that the order can be switched, e.g., n-type dopants where p-type dopants are employed, and p-type dopants where n-type dopants are employed.

Embodiments of the disclosure provide a photodetector that is easy to manufacture and can be integrated into CMOS and Bi-CMOS devices. The reflectors including a buried air gap that acts as mirrors adjacent to the optical semiconductor material, allowing a thinner optical semiconductor material to be used. Hence, the disclosure is advantageous to reduce a thickness of, for example, an intrinsic germanium photodetecting region. While the photodetecting region is thinner, it can still absorb electromagnetic radiation and, in particular, longer wavelengths of electromagnetic radiation, due to the reflectivity provided by the reflectors. The air gaps provide the desired reflectivity despite being arranged parallel to the path of the incident electromagnetic radiation.

The method as described above may be used in the fabrication of photonic chips and/or integrated circuit chips. The resulting chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes photonic chips and/or integrated circuit chips, ranging from toys and other low-end applications to advanced computer products having a display, a telecommunications device, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A photodetector, comprising:
a photodetecting region in a semiconductor substrate; and
a reflector extending at least partially along a sidewall of the photodetecting region in the semiconductor substrate, the reflector including an air gap defined in the semiconductor substrate, wherein the air gap includes a pinch off closure including a semiconductor.

2. The photodetector of claim 1, wherein the air gap is oriented parallel to a path of incident electromagnetic radiation.

3. The photodetector of claim 1, wherein the air gap extends vertically along substantially all of the sidewall of the photodetecting region.

4. The photodetector of claim 1, wherein the air gap extends vertically along a portion of the sidewall of the photodetecting region.

5. The photodetector of claim 1, wherein the air gap includes a plurality of interconnected voids in the semiconductor substrate.

6. The photodetector of claim 1, wherein the air gap includes a concave inner surface.

7. The photodetector of claim 1, wherein the air gap includes a plurality of interconnected internal surfaces creating a polygonal cross-section.

8. The photodetector of claim 1, wherein the air gap surrounds the photodetecting region.

9. The photodetector of claim 1, wherein the air gap includes a plurality of spaced air gaps surrounding the photodetecting region.

10. The photodetector of claim 1, further comprising a liner along at least a portion of an inner surface of the air gap.

11. The photodetector of claim 10, wherein the liner includes at least one of: a dielectric and an anti-reflective layer.

12. The photodetector of claim 1, wherein the air gap is defined in a dielectric within a deep trench.

13. The photodetector of claim 1, wherein the semiconductor substrate includes an n-type semiconductor, and the photodetecting region includes one of: intrinsic germanium, and intrinsic germanium in a p-type semiconductor liner, and wherein the photodetecting region further includes a p-type semiconductor layer over the one of: intrinsic germanium, and intrinsic germanium in the p-type semiconductor liner.

14. A method, comprising:

forming a photodetecting region in a semiconductor substrate; and forming a reflector extending at least partially along a sidewall of the photodetecting region in the semiconductor substrate, the reflector including an air gap defined in the semiconductor substrate, and wherein forming the reflector includes forming an opening in the semiconductor substrate using a crystallographic etch, and sealing the opening to form the air gap with a pinch off closure including semiconductor.

15. The method of claim 14, wherein forming the photodetecting region occurs prior to forming the reflector.

16. The method of claim 14, wherein forming the reflector includes forming an opening in the semiconductor substrate, forming a liner on at least a portion of an inner surface of the opening, and sealing the opening to form the air gap.

17. The method of claim 14, wherein forming the reflector includes forming a plurality of air gaps surrounding the photodetecting region.

18. The method of claim 14, wherein forming the reflector includes forming an opening in the semiconductor substrate using a crystallographic etch, and sealing the opening to form the air gap.

19. A photodetector, comprising:

a photodetecting region in a semiconductor substrate wherein the semiconductor substrate includes an n-type semiconductor, and wherein the photodetecting region includes one of: intrinsic germanium and intrinsic germanium in a p-type semiconductor liner, and further includes a p-type semiconductor layer over the one of: intrinsic germanium and intrinsic germanium in the p-type semiconductor liner; and a reflector extending at least partially along a sidewall of the photodetecting region in the semiconductor substrate, the reflector including an air gap defined in the semiconductor substrate.

\* \* \* \* \*